(12) United States Patent
Ping

(10) Patent No.: US 6,518,611 B1
(45) Date of Patent: *Feb. 11, 2003

(54) CAPACITOR ARRAY STRUCTURE FOR SEMICONDUCTOR DEVICES

(75) Inventor: Er-Xuan Ping, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/698,887

(22) Filed: Oct. 27, 2000

Related U.S. Application Data

(60) Continuation of application No. 09/160,232, filed on Sep. 24, 1998, now Pat. No. 6,153,899, which is a division of application No. 08/893,931, filed on Jul. 14, 1997, now Pat. No. 5,851,875.

(51) Int. Cl.$^7$ ........................ H01L 27/108; H01L 29/76; H01L 29/94; H01L 31/119
(52) U.S. Cl. ........................ 257/296; 257/306; 257/308; 257/309
(58) Field of Search .................... 257/308, 3.9, 303, 257/296, 306, 68, 71; 438/238, 239, 240, 250, 251, 253

(56) References Cited

U.S. PATENT DOCUMENTS

| | | | |
|---|---|---|---|
| 5,138,412 A | 8/1992 | Hieda et al. | 257/296 |
| 5,691,219 A | 11/1997 | Kawakubo et al. | 438/253 |
| 5,712,813 A | 1/1998 | Zhang | 365/149 |
| 5,721,168 A | 2/1998 | Wu | |
| 5,726,086 A | 3/1998 | Wu | |
| 5,851,875 A | * 12/1998 | Ping | 438/253 |
| 6,153,899 A | * 11/2000 | Ping | 257/296 |

* cited by examiner

Primary Examiner—Tom Thomas
Assistant Examiner—Douglas W. Owens

(57) ABSTRACT

Exemplary embodiments of the present invention teach a structure and process for forming an array of storage capacitors by forming a first set of individual storage node plates, forming alternating storage node pillars, forming a second set of individual storage node plates, forming a cell dielectric material on individual storage node plates, and forming a second capacitor plate over the first and second sets of individual storage node plates. The resulting structure comprises generally parallel running conductive word lines, a first set of individual storage node plates, storage node pillars alternating with individual storage node plates of the first set of individual storage node plates, a second set of individual storage node plates, a cell dielectric material on the first and second sets of individual storage node plates, and a second capacitor plate overlying the first and second sets of individual storage node plates.

16 Claims, 9 Drawing Sheets

CAPACITOR ARRAY STRUCTURE FOR SEMICONDUCTOR DEVICES

This application is a continuation to U.S. patent application Ser. No. 09/160,232, filed Sep. 24, 1998, now U.S. Pat. No. 6,153,899 which is a divisional to U.S. Pat. No. Ser. 08/893,931 filed Jul. 14. 1997, 5,851,875, issued Dec. 22, 1998.

FIELD OF THE INVENTION

This invention relates to semiconductor fabrication processing and more particularly to a structure and process for forming an array of capacitors for a dynamic random access memory device.

BACKGROUND OF THE INVENTION

The continuing trend of scaling down integrated circuits has forced the semiconductor industry to consider new techniques for fabricating precise components at sub-micron levels. Along with the need for smaller components, there has been a growing demand for devices requiring less power consumption. In the manufacture of transistors, these trends have led the industry to refine approaches to achieve thinner cell dielectric and gate oxide layers.

In dynamic semiconductor memory storage devices it is essential that storage node capacitor cell plates be large enough to retain an adequate charge (or capacitance) in spite of parasitic capacitance and noise that may be present during circuit operation. As is the case for most semiconductor integrated circuitry, circuit density is continuing to increase at a fairly constant rate. The issue of maintaining storage node capacitance is particularly important as the density of dynamic random access memory (DRAM arrays continues to increase for future generations of memory devices. The ability to densely pack storage cells while maintaining required capacitance levels is a crucial requirement of semiconductor manufacturing technologies if future generations of expanded memory array devices are to be successfully manufactured.

As disclosed in U.S. Pat. No. 5,418,180, and U.S. Pat. No. 5,407,534, Hemi-Spherical Grain (HSG) silicon enhances storage capacitance when used to form the storage node electrode without increasing the area required for the cell or the storage electrode height.

A disadvantage of using HSG to form a capacitor structure (such as a container type structure) in a deep sub-micron process (a process utilizing lines width of less than 0.25 microns) is that a small change in the processing conditions may result in the grains of the silicon to overgrow and form discontinuous islands. When the size of the container formation needs to be reduced to such a degree that only a thin film is feasible, the grain formation could quite possibly consume all of the silicon film and form completely isolated grains. Additionally, the space between containers needs to have enough margin to prevent shorts that can be caused by subsequent chemical cleaning. Furthermore, capacitor plate surface enhancement is a function of grain size when HSG is used and a grain size of 700–800 angstroms has been found to provide sufficient surface enhancement. However, a 700–800 angstrom grain size will not fit into a 0.18 µm or less container structured capacitor plate.

The present invention, develops a method to fabricate a capacitor structure for sub-micron fabrication processes. In particular, the present invention provides a capacitor fabrication solution for processes using a device geometry of 0.18 µm or smaller.

U.S. Pat. No. 5,418,180 and U.S. Pat. No. 5,407,534, are hereby incorporated by reference as if set forth in their entirety.

SUMMARY OF THE INVENTION

An exemplary implementation of the present invention teaches a process for fabricating a capacitor array for a semiconductor device by forming a first set of individual storage node plates for a first set of storage capacitors; forming a set of storage node pillars, the pillars alternating in position with the individual storage node plates of the first set of individual storage node plates, the storage node pillars being approximately equal in height to neighboring storage node plates. Next, a second set of individual storage node plates are formed so that each individual storage node plate is physically connected to an individual storage node pillar. Next, a cell dielectric material is formed on the first and second sets of individual storage node plates; and finally second capacitor plates are formed over the cell dielectric material and consequently the first and second sets of individual storage node plates.

Another exemplary implementation of the present invention is a memory array comprising conductive word lines running in a generally parallel direction to one another; a first set of individual storage node plates for a first set of storage capacitors; storage node pillars that alternate in position with the individual storage node plates of the first set of individual storage node plates, the storage node pillars being approximately equal in height to neighboring storage node plates; a second set of individual storage node plates for a second set of storage capacitors, each individual storage node plate of the second set physically connecting to an individual storage node pillar; a cell dielectric material on the first and second sets of individual storage node plates; and a second capacitor plate over the first and second sets of individual storage node plates.

DETAILED DESCRIPTION OF THE INVENTION

Exemplary implementations of the present invention are directed to a capacitor structure and process for forming a capacitor structure as depicted in FIGS. 1 through 4C. An exemplary implementation is depicted in the cross-sectional views of FIG. 1B, 2B, 3B and 4B. Another exemplary implementation is depicted in cross-sectional views of FIGS. 2C, 3C and 4C. Still another exemplary implementation is depicted in cross-sectional views of FIGS. 1B, 2B, 3B and 4A.

Figure 1A:
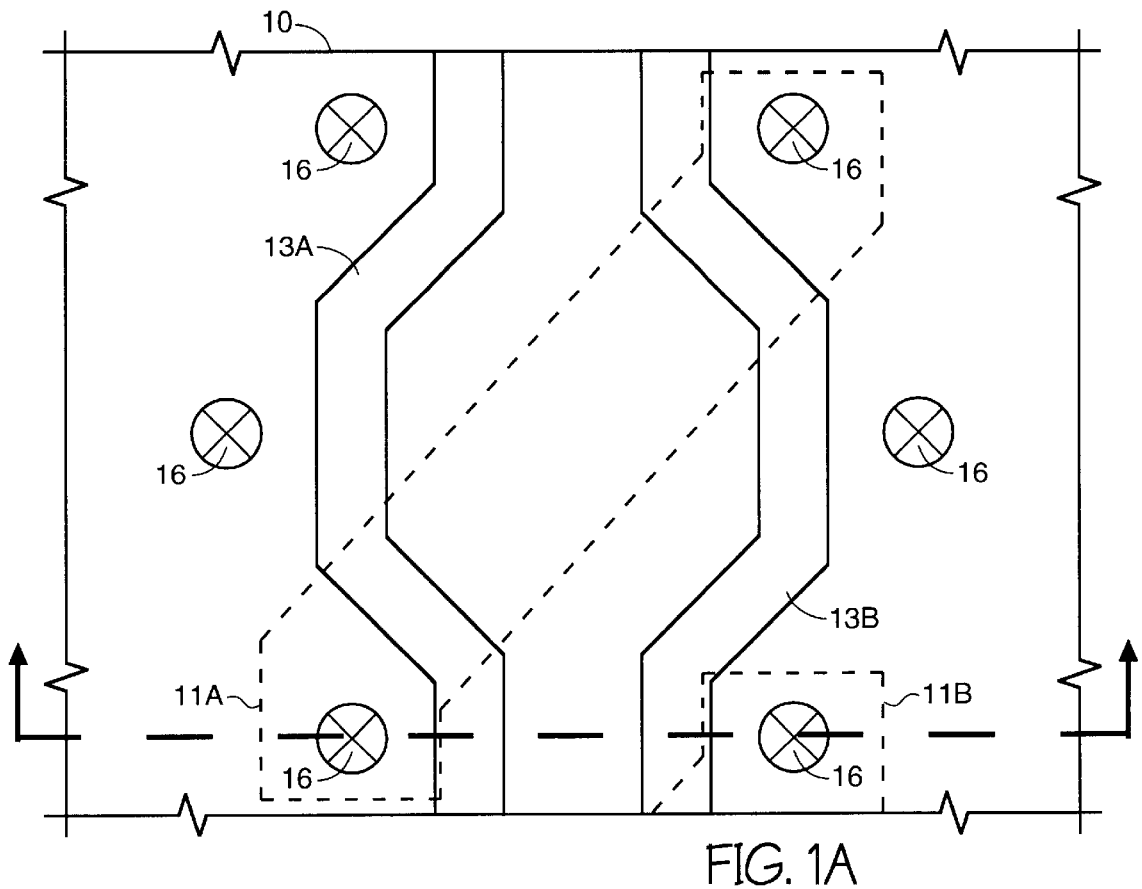
FIG. 1A, is a simplified overhead view taken during a patterning stage of the present invention depicting an array of conductive plugs positioned along a pair of conductive lines.

Referring to FIG. 1A, this overhead view shows an array of conductive plugs 16 positioned along a pair of conductive lines 13a and 13b. In this figure, two conductive lines run in a generally parallel direction to another which depict an exemplary implementation of the present invention, representing a plurality of word lines, that would be present in a memory array, such as a dynamic random access memory (DRAM). The following descriptions of the cross-sectional views are written to describe the formation of a single structure. However, it is intended that, though only a single structure is shown and described, a plurality of structures are being formed to create an array of such structures.

Figure 1B:
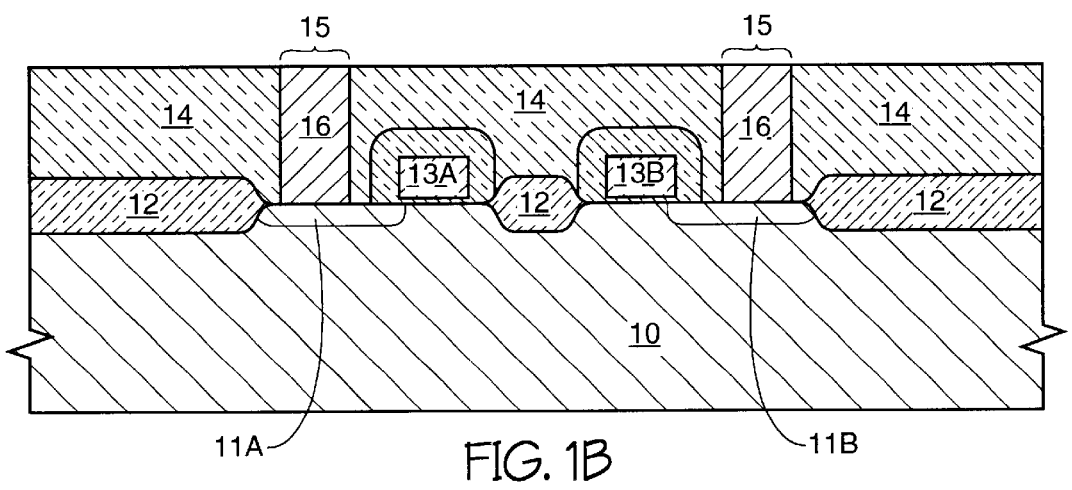
FIG. 1B, is a cross-sectional view of FIG. 1A, depicting storage capacitor access transistors followed by the formation of conductive plugs.

Referring to FIG. 1B, this view shows a silicon substrate 10 fabricated to form storage capacitor access transistors made up of source/drain diffusion areas 11a and 11b formed in substrate 10. The source/drain diffusion areas 11a and 11b are spanned by a conductive word lines 13a and 13b which, in turn, serve as access transistor gates. In this view an entire access transistor is not seen as a portion of the transistor's diffusion area is outside of the cross-sectional view (refer to the diffusion area 11a shown in FIG. 1A). Furthermore, the separate diffusion areas 11a and 11b are labeled as such in order to indicate that capacitors formed later in the process, associated with diffusion areas 11a and 11b, are coupled to a different set of digit lines (the formation of the digit lines are not discussed).

Isolation material 12, such as field oxidation, separate active areas 11a and 11b defined for the storage capacitor access transistors. Once the access transistors have been formed, a first thick insulation layer 14, such as a chemical vapor deposition (CVD) oxide or an oxide grown from tetraethylorthosilicate (TEOS), is formed over the access transistors and over isolation material 12. This first thick insulation layer 14 is planarized and patterned so that a subsequent etch will form openings 15 in insulation layer 14 to provide access to underlying first and second diffusion areas 11a and 11b. Next, a conductive material, such as conductively doped polysilicon or a metal, is formed such that it fills openings 15. The conductive material is then planarized to form conductive plugs 16.

Figure 2A:
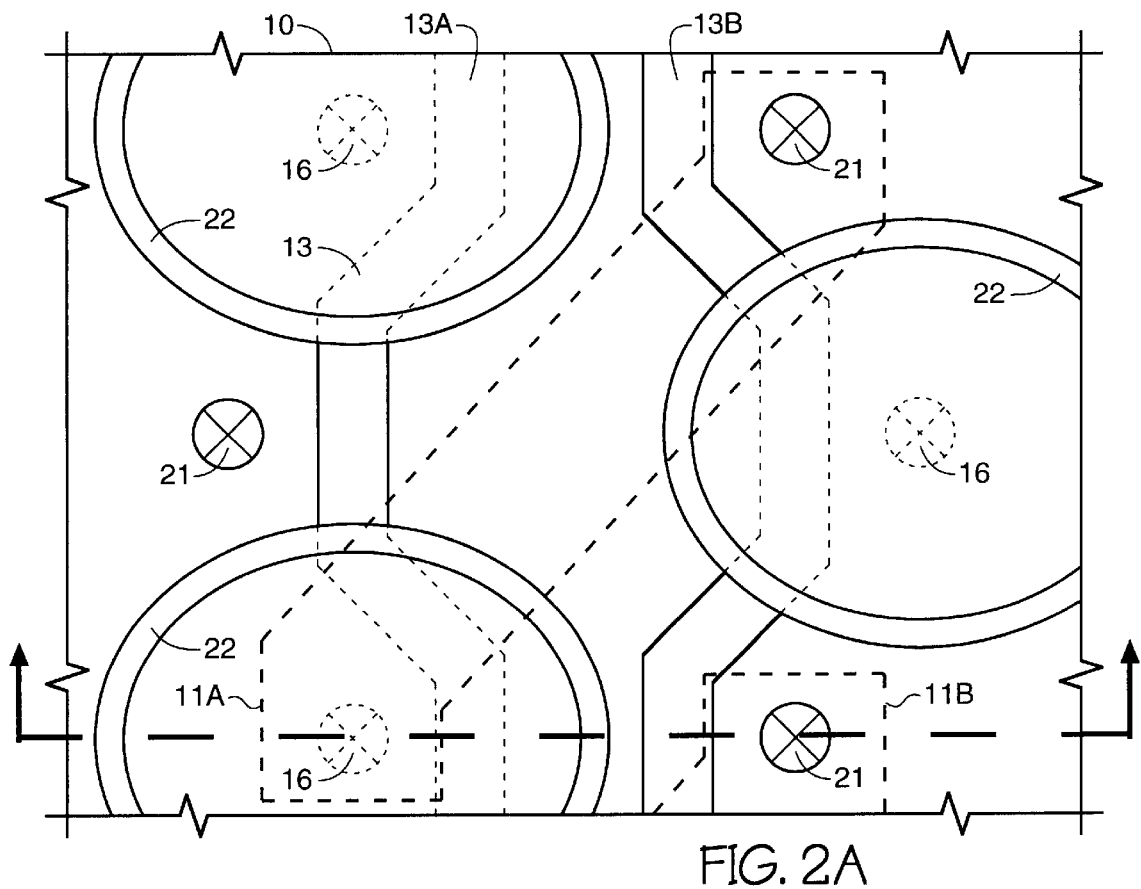
FIG. 2A, is a simplified overhead view taken during a patterning stage of the present invention depicting an array of alternating large and small conductive spheres representing lower storage node capacitor plates (large ovoids) and conductive plugs (small ovoids) positioned along a pair of conductive lines.

Referring to FIG. 2A, this overhead view shows the result of an alternating pattern of large and small ovoids (or ellipses) and is intended to show the formation of a first level of capacitor storage nodes plates 22 (large ovoids) and conductive extension plugs 21 (small ovoids) which will be formed after the next defined processing steps. Conductive plugs 16 (also shown as small ovoids) were formed in previous processing steps.

Figure 2B:
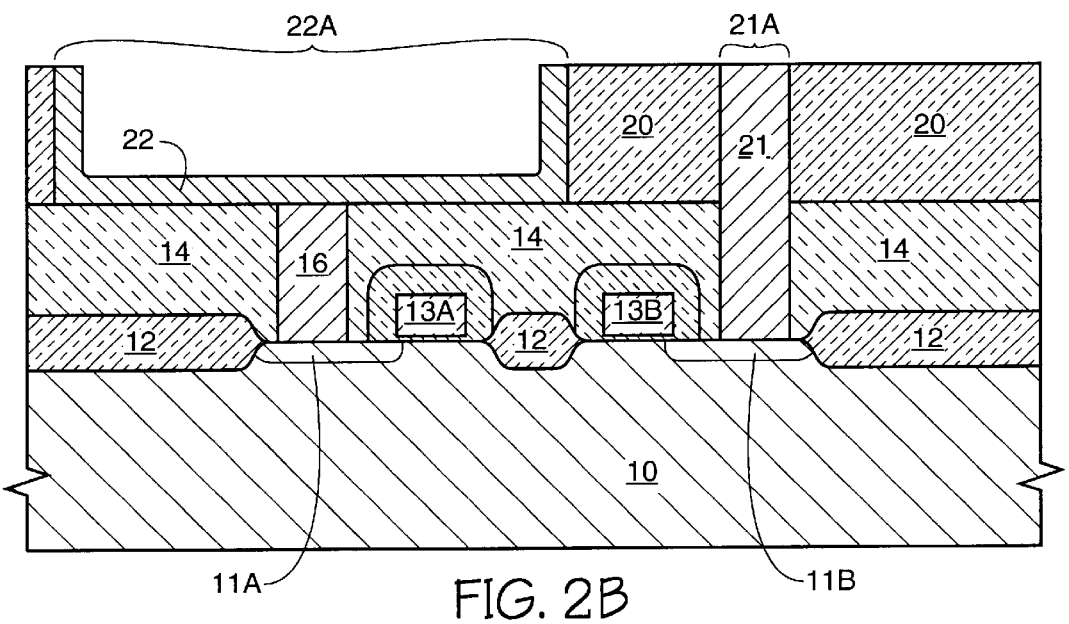
FIG. 2B, is a cross-sectional view of FIG. 2A, depicting the formation of a lower storage node capacitor plate and a conductive extension plug.

Referring to FIG. 2B the process steps to define the above structures are set forth. A second thick insulation layer 20, such as Borophosphosilicate glass (BPSG), is formed over the planarized first thick insulation layer 14 and over planarized conductive plugs 16. The second insulation layer 20 is planarized and patterned so that a subsequent etch will form first and second openings 22a and 21a in second insulation layer 20 to provide access to underlying conductive plugs 16. First opening 22a is patterned and etched so that it is large enough to except the formation of a storage node capacitor plate. During the same patterning and etching step, second opening 22a is created to provide access to second conductive plug 16. Next, a conductive material, such as, for example, conductively doped polysilicon, is formed such that it conforms to the geometry of first opening 22a and at the same time fills second opening 21a. The conductive material is then planarized to form a lower conductive storage node capacitor plate 22 and a conductive extension plug 21 (or storage node pillars). If conductively doped polysilicon is used, the polysilicon may be doped in situ during polysilicon deposition or the polysilicon may be doped after polysilicon deposition by such methods as implanting or diffusion.

Figure 2C:
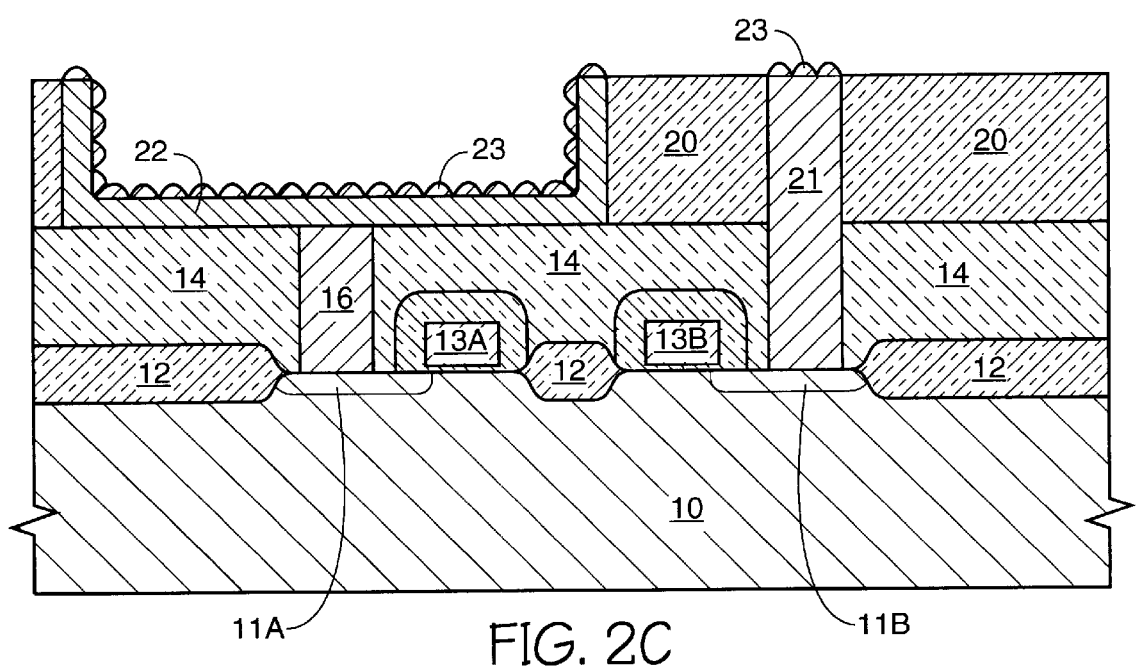
FIG. 2C, is an alternate embodiment showing a cross-sectional view of FIG. 2A, depicting the formation of a lower storage node capacitor plate, a conductive extension plug and texturizing the lower storage node capacitor plate.

In an alternate embodiment and referring to FIG. 2C, while lower plate 22 is Hemi-Spherical Grain (HSG) silicon 23 is deposited onto lower plate 22. The HSG silicon may be formed by various methods known to those skilled in the art and in particular by the methods of HSG formation as disclosed in U.S. Pat. Nos. 5,418,180 and 5,407,534. The use of HSG silicon will increase the capacitance of storage node capacitor plate 22 by increasing the plate's surface area.

Figure 3A:
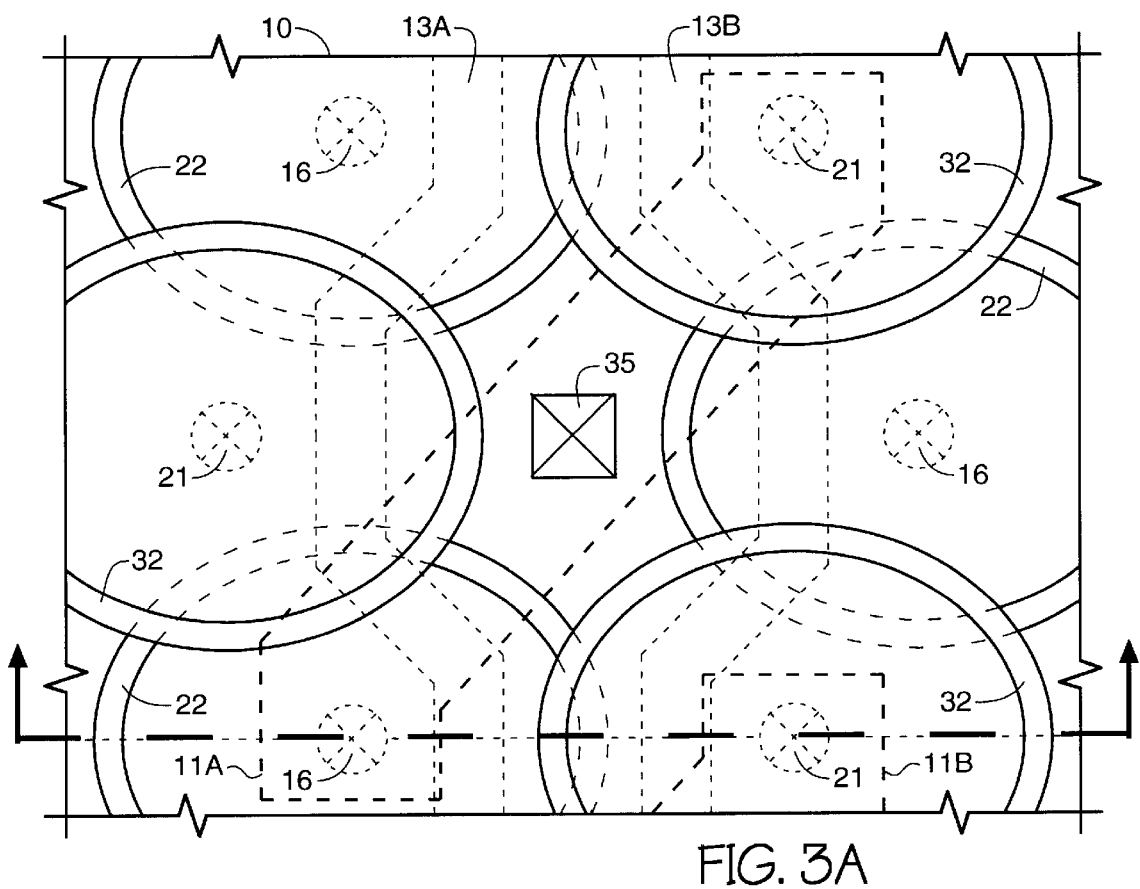
FIG. 3A, is a simplified overhead view taken during a patterning stage of the present invention depicting an array of overlapping large conductive spheres representing lower storage node capacitor plates being overlapped by storage node capacitor plates, all of which are positioned along a pair of conductive lines.

Referring to FIG. 3A, this overhead view shows the overlapping of large ovoids 22 and 32 and is intended to show the formation of a second level of capacitor storage nodes plates 32 which overlap the previously formed first level of capacitor storage nodes plates 22.

Figure 3B:
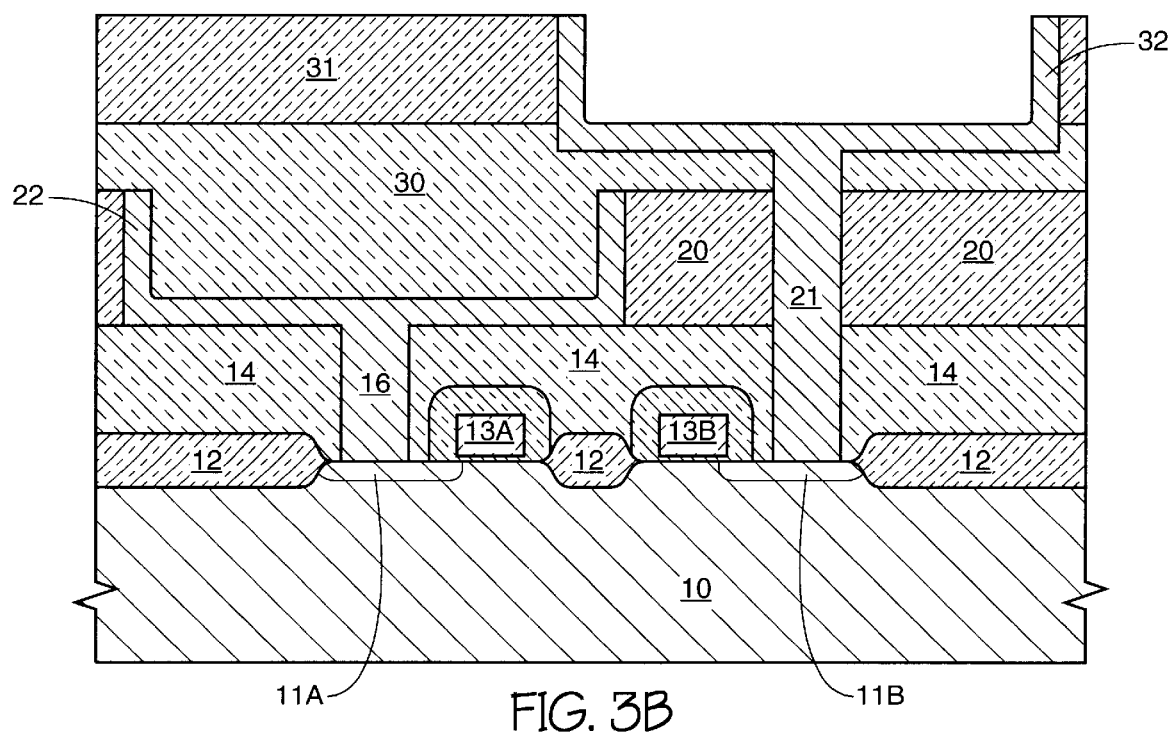
FIG. 3B, is a cross-sectional view of FIG. 3A, depicting the formation of an upper storage node capacitor plate.

Referring to FIG. 3B, a third thick insulation layer 30, such as, again an CVD oxide or an oxide formed from TEOS, is formed over the planarized second thick insulation layer 20, lower storage node capacitor plate 22 and. planarized conductive extension plug 21. The third thick insulation layer 30 is planarized and then covered with a fourth thick insulation layer 31, such as BPSG. Next, the fourth thick insulation layer 31 is patterned so that a subsequent etch will form an opening in fourth insulation layer 31 until the underlying third thick insulating layer 30 is reached. At this point a facet etch, such as an angled sputter etch or reactive ion etch, is performed to provide access to underlying conductive extension plug while creating sloped side walls in third thick insulating layer 30 so that a portion of third thick insulating layer 30 remains intact to completely cover lower storage node capacitor plate 22. This will ensure complete isolation between an upper storage node capacitor plate 32 that is to be formed in this opening and lower storage node capacitor plate 22. This opening is patterned large enough to except the formation of storage node capacitor plate 32 and will also overlap the edge of underlying lower storage node capacitor plate 22, but as previously stated, the upper and lower storage node capacitor plate will be completed isolated from one another other. Next, a conductive material, such as conductively doped polysilicon, is formed such that it conforms to the geometry of opening. The conductive material is then planarized to form a conductive upper storage node capacitor plate 32, which overlaps the lower storage node capacitor plate 22. As before, if conductively doped polysilicon is used to form storage node capacitor plate 32, the polysilicon may be doped insitu during polysilicon deposition or the polysilicon may be doped after polysilicon deposition by such methods as implanting or diffusion.

Figure 3C:
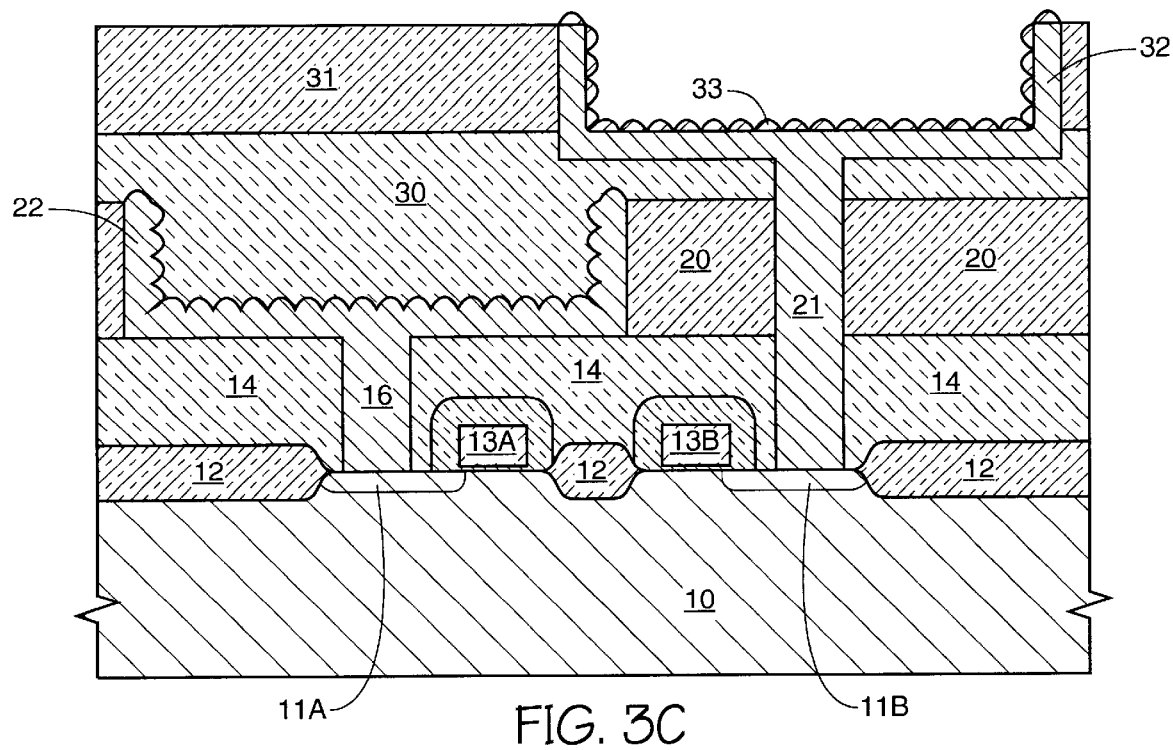
FIG. 3C, is an alternate embodiment showing a cross-sectional view of FIG. 3A, depicting the formation of an upper storage node capacitor plate and texturizing of the upper storage node capacitor plate.

In an alternate embodiment and referring to FIG. 3C, while upper plate 32 is exposed, Hemi-Spherical Grain (HSG) silicon 33 is deposited onto upper plate 32. As before, the HSG silicon may be formed by various methods known to those skilled in the art and in particular by the methods of HSG formation as disclosed in U.S. Pat. Nos. 5,418,180 and 5,407,534. This HSG silicon will increase the capacitance of storage node capacitor plate 32 by increasing the plate's surface area.

Figure 4A:
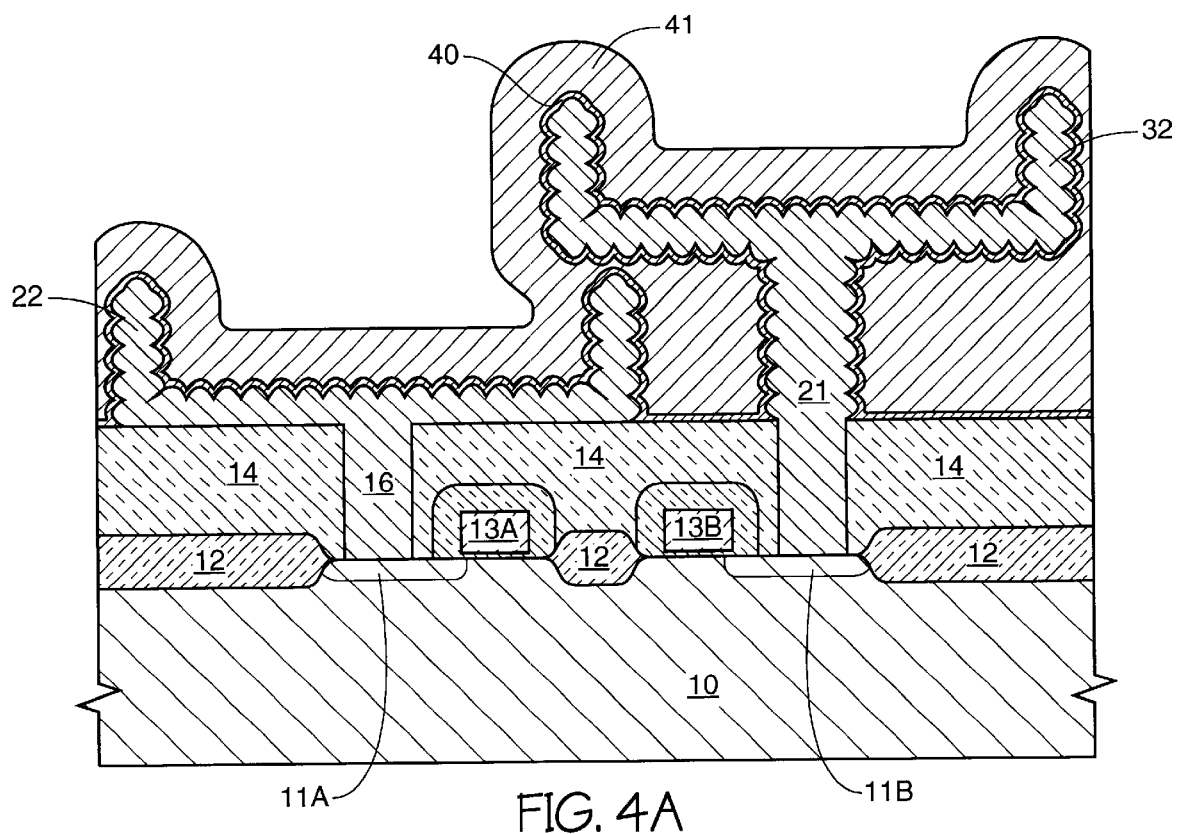
FIG. 4A, is an alternate embodiment showing a continuing cross-sectional view of FIG. 3B, depicting the formation of HSG silicon on both the inside and outside surfaces of a storage node capacitor plate, the formation an storage capacitor cell dielectric and a second storage capacitor plate.
Figure 4B:
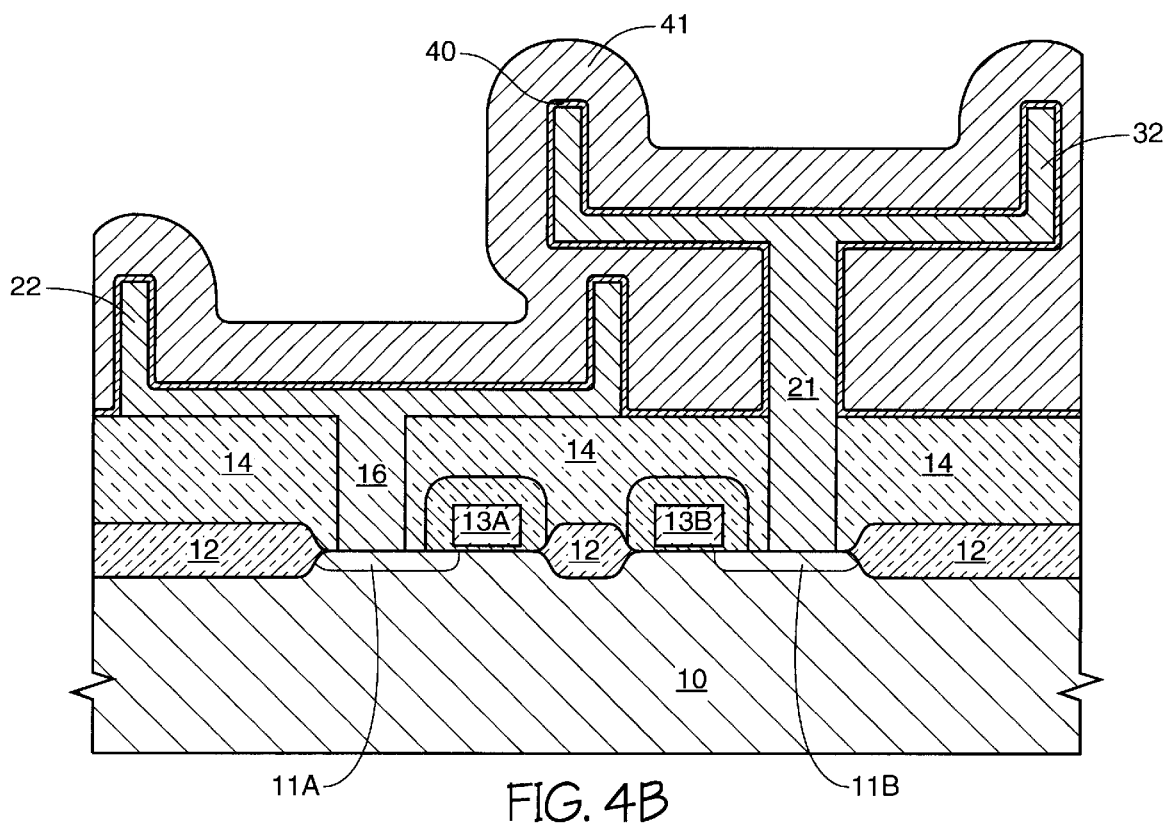
FIG. 4B, is a continuing cross-sectional view of FIG. 3B, depicting the formation of an storage capacitor cell dielectric and a second storage capacitor plate.

Referring to FIGS. 4A and 4B, an isotropic etch is performed that will remove all of fourth thick insulation layer 31 and a portion of third thick insulation layer 30. This etch must be performed long enough to ensure that all of the insulation is cleared from the inner surface of lower storage node capacitor plate 22. At this point, as shown in FIG. 4A, it is desirable to texturize the exposed surfaces (both the inner and outer surfaces) of both the lower and upper storage node capacitor plates 22 and 32.

Alternatively, as shown in FIG. 4B, lower plate 22 and upper plate 32 need not be texturized if sufficient surface area is obtained. However, the overlapping of the storage node plates will allow sufficient surface area to except texturization of the storage node plates by such methods as depositing Hemi-Spherical Grain (HSG) silicon. In fact, a major advantage of the present invention is the overlapping of the upper and lower storage node plates 22 and 32 which will allow the creation of storage capacitors having adequate capacitance to effectively store a charge for a duration necessary for data retention in DRAMs using a device geometry process of 0.18 micrometers ($\mu$m) or less. The present invention further provides for the formation of an array of storage capacitors that are relatively consistent in capacitor plate surface area and thus relatively constant in capacitance (a desired capacitance range of 20 to 30 fF for each capacitor) from capacitor to capacitor.

Continuing with either FIGS. 4A and 4B, once the conductive surfaces of the lower and upper plates are fabricated as desired, a storage capacitor cell dielectric 40 is formed next to the conductive surfaces of each lower and upper plate 22 and 33. Finally, a second capacitor plate 41 is formed over the lower and upper storage capacitor plates to complete the formation of a storage cell comprising an access transistor and a storage capacitor.

Figure 4C:
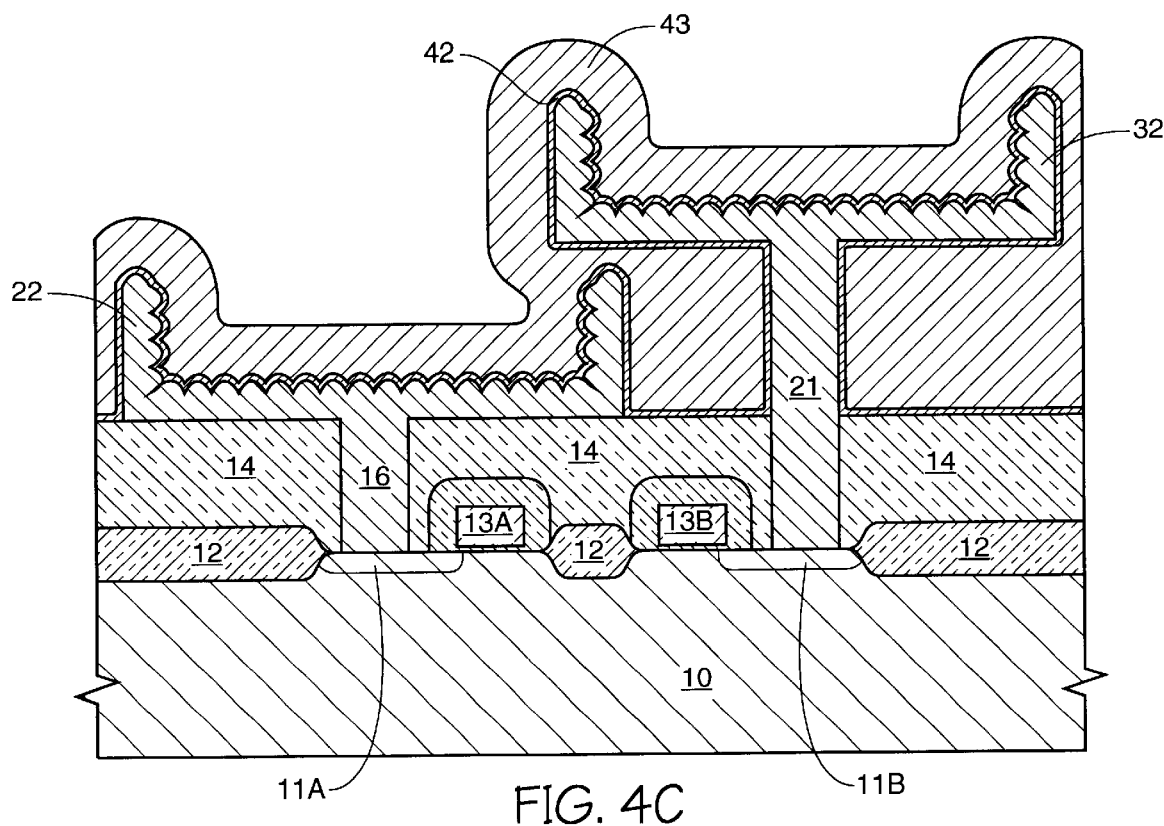
FIG. 4C, is an alternate embodiment showing a continuing cross-sectional view of FIG. 3C, depicting the formation of an storage capacitor cell dielectric and a second storage capacitor plate.

In an alternate embodiment and referring to FIG. 4C, the inner surfaces of upper and lower plates 22 and 32 have been textured in accordance with the process steps of FIGS. 2C and 3C. Next, a storage capacitor cell dielectric 42 is formed next to the conductive surfaces of each lower and upper plate 22 and 33. Finally, a second capacitor plate 43 is formed over the lower and upper storage capacitor plates to complete the formation of a storage cell comprising an access transistor and a storage capacitor.

Referring back to FIG. 3A, contact 35 shows the location for a contact between an exposed diffusion region and a second conductive line, such as for a digit or bit line in a DRAM. This contact can be formed using conventional fabrication techniques after the second storage cell plate is formed. Alternatively, the exemplary embodiments of the present invention may also be implemented in a process that forms buried digit lines where the word lines and storage capacitors are built over the buried digit lines. In fact, the present invention may integrate into a buried digit line process very effectively.

It is to be understood that although the present invention has been described with reference to a preferred embodiment, various modifications, known to those skilled in the art, may be made to the structures and process steps presented herein without departing from the invention as recited in the is several claims appended hereto.

What is claimed is:

1. A memory array in a dynamic random access device, said memory array comprising:

a first set of individual storage node plates for a first set of storage capacitors arranged along conductive word lines;

storage node pillars that alternate in position with said individual storage node plates of said first set of individual storage node plates, said storage node pillars being approximately equal in height to neighboring individual storage node plates;

a second set of individual storage node plates for a second set of storage capacitors arranged along said conductive word lines, each said individual storage node plate of said second set physically connecting to an individual storage node pillar;

a cell dielectric material on said first and second sets of individual storage node plates;

a second capacitor plate over said first and second sets of individual storage node plates, said second capacitor plate being in common to all said storage capacitors;

wherein each capacitor from said first set is paired with a capacitor from said second set by being diagonally associated to one another by a common active area.

2. The memory array as recited in claim 1, wherein said first and second set of individual storage node plates are similar in size.

3. The memory array as recited in claim 1, wherein said first and second set of individual storage node plates are similar in size such that the capacitance of each storage capacitor is relatively constant.

4. The memory array as recited in claim 3, wherein said second set of individual storage node plates overlaps said first set of individual storage node plates in an alternating pattern.

5. The memory array as recited in claim 1, wherein each said storage node plate possesses a textured surface.

6. The memory array as recited in claim 5, wherein each said storage node plate possesses a Hemi-Spherecal Grain (HSG) silicon film.

7. A memory array in a dynamic random access device, said memory array comprising:

a first set of individual storage node plates for a first set of storage capacitors arranged along conductive word lines;

storage node pillars that alternate in position with said individual storage node plates of said first set of individual storage node plates, said storage node pillars being approximately equal in height to neighboring individual storage node plates;

a second set of individual storage node plates for a second set of storage capacitors arranged along said conductive word lines, each said individual storage node plate of said second set physically connecting to an individual storage node pillar;

a cell dielectric material on said first and second sets of individual storage node plates, said cell dielectric material being a continuous dielectric layer in common to all said individual storage node plates;

a second capacitor plate over said first and second sets of individual storage node plates;

wherein each capacitor from said first set is paired with a capacitor from said second set by being diagonally associated to one another by a common active area.

8. The memory array as recited in claim 7, wherein said first and second set of individual storage node plates are similar in size.

9. The memory array as recited in claim 7, wherein said first and second set of individual storage node plates are similar in size such that the capacitance of each storage capacitor is relatively constant.

10. The memory array as recited in claim 9, wherein said second set of individual storage node plates overlaps said first set of individual storage node plates in an alternating pattern.

11. The memory array as recited in claim 7, wherein each said storage node plate possesses a textured surface.

12. The memory array as recited in claim 7, wherein each said storage node plate possesses a Hemi-Spherecal Grain (HSG) silicon film.

13. A process for forming a memory array of storage capacitors in a dynamic random access device, said process comprising the steps of:

forming a first set of individual storage node plates for a first set of storage capacitors;

forming a set of storage node pillars that alternates in position with said individual storage node plates of said first set of individual storage node plates, said storage node pillars being approximately equal in height to neighboring storage node plates;

forming a second set of individual storage node plates for a second set of storage capacitors, each said individual storage node plate of said second set physically connecting to an individual storage node pillar;

forming a cell dielectric material on said first and second sets of individual storage node plates;

forming a second capacitor plate over said first and second sets of individual storage node plates.

14. The process as recited in claim 13, further comprising the step of forming of a conductive textured surface on an inner surface of each said storage node plate.

15. The process as recited in claim 13, further comprising the step of forming of a conductive textured surface on both an inner and outer surface of each said storage node plate.

16. The process as recited in claim 13, wherein said process comprises a device geometry process of 0.18 micrometers or less.

* * * * *